(12) United States Patent
Wyatt et al.

(10) Patent No.: US 10,497,527 B2
(45) Date of Patent: Dec. 3, 2019

(54) SWITCH WITH CUSTOMIZED CIRCUIT BOARD ELECTRICAL CONTACT PAD PLACEMENT USING SELECTIVELY MOUNTED ELECTRICAL CONTACTORS

(71) Applicant: SAFRAN ELECTRICAL & POWER, Blagnac (FR)

(72) Inventors: Christopher Kenneth Wyatt, Bradenton, FL (US); James Broadwell, Parrish, FL (US); Dean Morgan, Lakeland, FL (US)

(73) Assignee: SAFRAN ELECTRICAL & POWER, Blagnac (FI)

( * ) Notice: Subject to any disclaimer, the term of this patent is extended or adjusted under 35 U.S.C. 154(b) by 0 days.

(21) Appl. No.: 15/959,428

(22) Filed: Apr. 23, 2018

(65) Prior Publication Data

US 2018/0315574 A1    Nov. 1, 2018

Related U.S. Application Data

(60) Provisional application No. 62/490,403, filed on Apr. 26, 2017.

(51) Int. Cl.
*H01H 1/58* (2006.01)
*H01H 11/00* (2006.01)
(Continued)

(52) U.S. Cl.
CPC .......... *H01H 71/46* (2013.01); *H01H 1/5805* (2013.01); *H01H 11/0012* (2013.01);
(Continued)

(58) Field of Classification Search
CPC .... H01H 71/46; H01H 50/545; H01H 50/541; H01H 11/0012; H01H 2003/323;
(Continued)

(56) References Cited

U.S. PATENT DOCUMENTS 3,837,818 A * 9/1974 Happ .................... B32B 15/015
                                                    428/601
5,677,655 A    10/1997 Hinata et al.
(Continued)

FOREIGN PATENT DOCUMENTS

WO    2018/144426 A1    8/2018

OTHER PUBLICATIONS

International Search Report and Written Opinion dated Sep. 18, 2018, 67 pages.

*Primary Examiner* — Vanessa Girardi
(74) *Attorney, Agent, or Firm* — Rankin, Hill & Clark LLP (57) ABSTRACT

A modular auxiliary switch includes a housing including a first housing part and a separate second housing part secured to the first housing part. A printed circuit board is housed in one of the first and second housing parts, and has a first side facing the first housing part and a second opposite side facing the second housing part. An actuator mechanism is housed in the first housing part and is coupled to the printed circuit board. A separate first electrical contactor is selectively mounted to the printed circuit board so that a first electrical contact surface of the first electrical contactor overlaps and is in direct contact with one of the first side and the second side to define a first electrical contact pad on the printed circuit board.

17 Claims, 6 Drawing Sheets

(51) Int. Cl.
*H05K 1/14* (2006.01)
*H01H 71/46* (2006.01)
*H01H 73/06* (2006.01)
*H01H 50/54* (2006.01)
*H01H 11/04* (2006.01)
*H01H 3/32* (2006.01)

(52) U.S. Cl.
CPC .......... *H01H 11/04* (2013.01); *H01H 50/541* (2013.01); *H01H 50/545* (2013.01); *H01H 73/06* (2013.01); *H05K 1/141* (2013.01); *H01H 2003/323* (2013.01); *H01H 2011/046* (2013.01)

(58) Field of Classification Search
CPC .. H01H 2001/247; H01H 1/5805; H01H 1/36; H01H 1/365; H01H 1/403; H01H 1/44; H01H 1/24; H05K 2201/10053; H05K 2201/10446
See application file for complete search history.

(56) References Cited

U.S. PATENT DOCUMENTS

| | | | |
|---|---|---|---|
| 6,753,486 B2 * | 6/2004 | Matsui | H01H 1/5805 200/282 |
| 9,464,710 B2 * | 10/2016 | Takeda | H01H 13/20 |
| 2003/0141174 A1 | 7/2003 | Matsui | |

* cited by examiner

SWITCH WITH CUSTOMIZED CIRCUIT BOARD ELECTRICAL CONTACT PAD PLACEMENT USING SELECTIVELY MOUNTED ELECTRICAL CONTACTORS

BACKGROUND

Conventional contactor auxiliary switches comprise contacts that are typically required to handle 10 milliamps to 5 amps. In order to switch this range of current in harsh environments the contact surfaces require silver plating for currents levels from 100 mA to 5 A and the contact surfaces require gold plating for current levels below 100 mA. Therefore, in order to work across the required 10 mA to 5 A current range, the contacts are electro-plated with gold over silver plating.

In some conventional contactor auxiliary switches, the contacts are in the form of rectangular electrical pads that are embedded on the substrate of a printed circuit board. Further, the electrical pads have exposed contact surfaces. For this type of contactor auxiliary switch, in order to work across the required 10 mA to 5 A current range, the contact surfaces of the electrical pads must also be electro-plated with gold over silver plating. However, this type of electro-plating on a printed circuit board is not a currently available option.

SUMMARY

According to one aspect, a modular auxiliary switch comprises a housing including a first housing part and a separate second housing part secured to the first housing part. A printed circuit board is housed in one of the first housing part and the second housing part. The printed circuit board has a first side facing the first housing part and a second opposite side facing the second housing part. An actuator mechanism is housed in the first housing part and is coupled to the printed circuit board. A separate first electrical contactor is selectively mounted to the printed circuit board so that a first electrical contact surface of the first electrical contactor overlaps and is in direct contact with one of the first side and the second side to define a first electrical contact pad on the printed circuit board.

According to another aspect, a modular assembly for an auxiliary switch comprises a printed circuit board including a first side and a second opposite side. A first electrical contact separate from the printed circuit board has a planar first wall, a trifurcated second wall spaced from the first wall and having an arcuate section extending toward the first wall, and a base wall interconnecting the first and second walls. The first electrical contact is selectively fixed to the printed circuit board with the first wall in direct contact with the first side to define a first electrical contact pad on the printed circuit board and the second trifurcated wall in direct contact with the second side.

According to another aspect, an electrical contact for connection to a printed circuit board of an auxiliary switch comprises a first wall, a second wall overlapping the first wall, and a base wall interconnecting ends of the respective first and second walls. The second wall has a first portion which extends parallel to the first wall and an arcuate shaped second portion. The electrical contact is formed of a spring steel and includes a first plating comprised of silver and a second exterior plating comprised of gold.

According to yet another aspect, a method of configuring an auxiliary switch comprises providing a printed circuit board having a first side and an opposite second side; and providing a separate first electrical contactor configured to be mounted to the printed circuit board so that a first electrical contact surface of the first electrical contactor overlaps and is in direct contact with one of the first side to configure the auxiliary switch as a normally closed single pole single throw switch and the second side of the printed circuit board to configure the auxiliary switch as a normally open single pole single throw switch.

DETAILED DESCRIPTION

Figure 1:
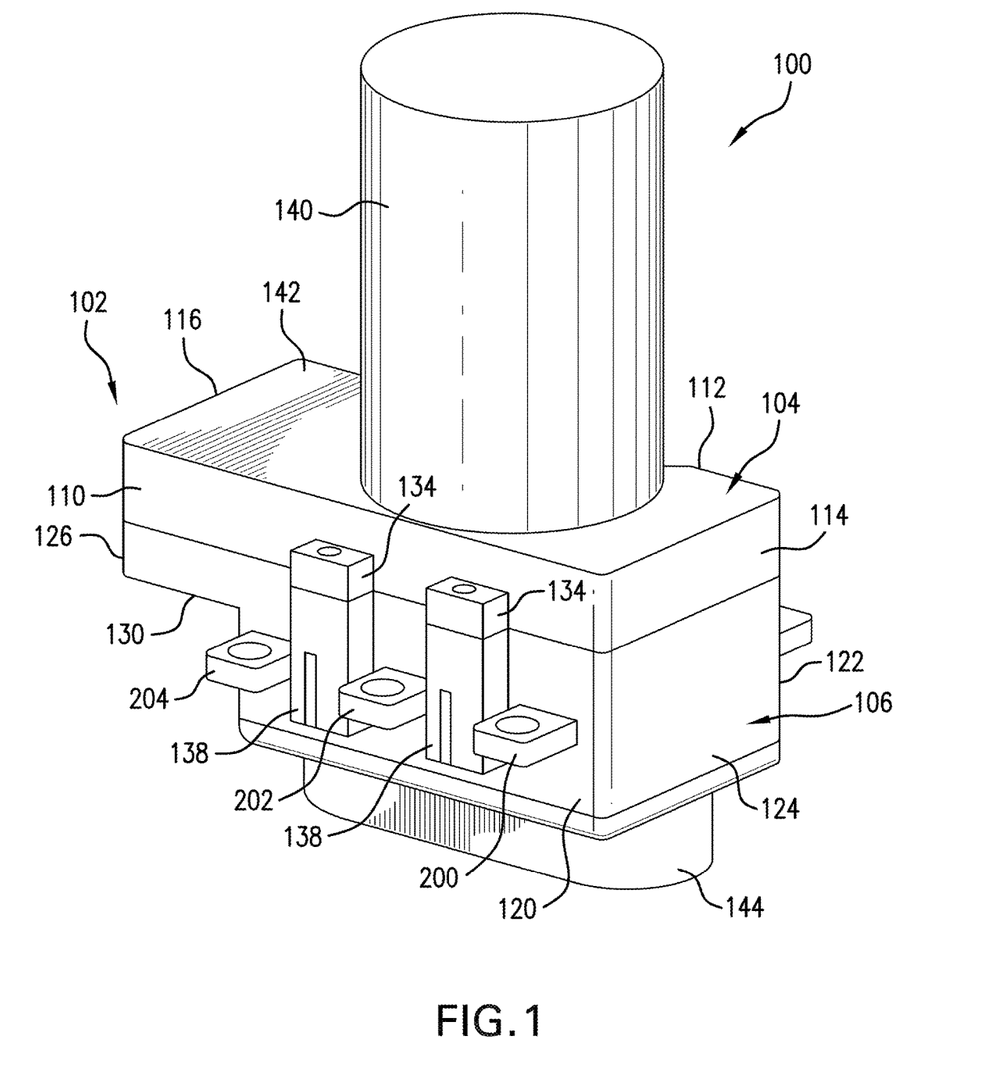
FIG. 1 is a perspective view of an auxiliary switch according to the present disclosure.
Figure 2:
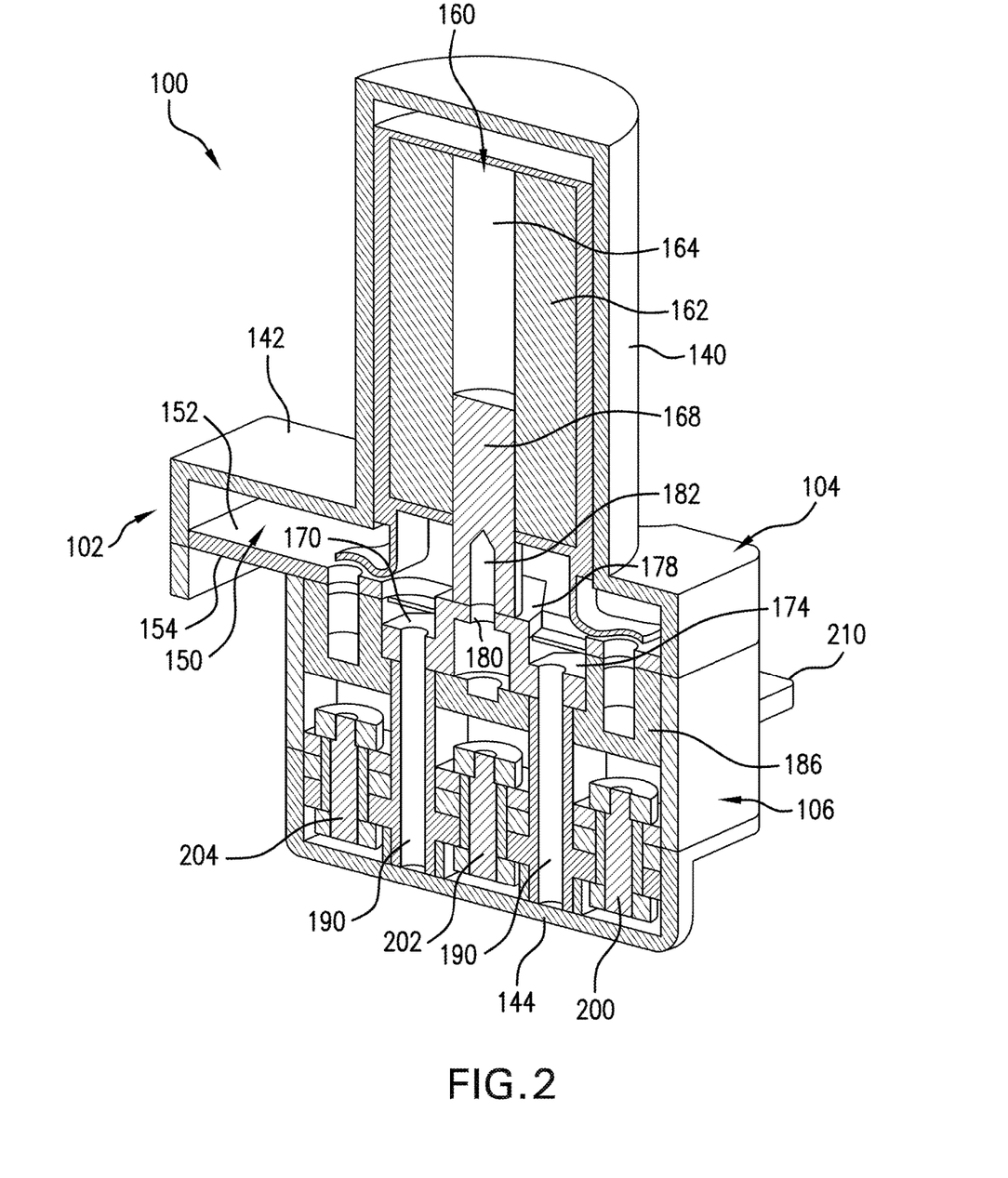
FIG. 2 is a cross-sectional view of the auxiliary switch of FIG. 1.
Figure 3:
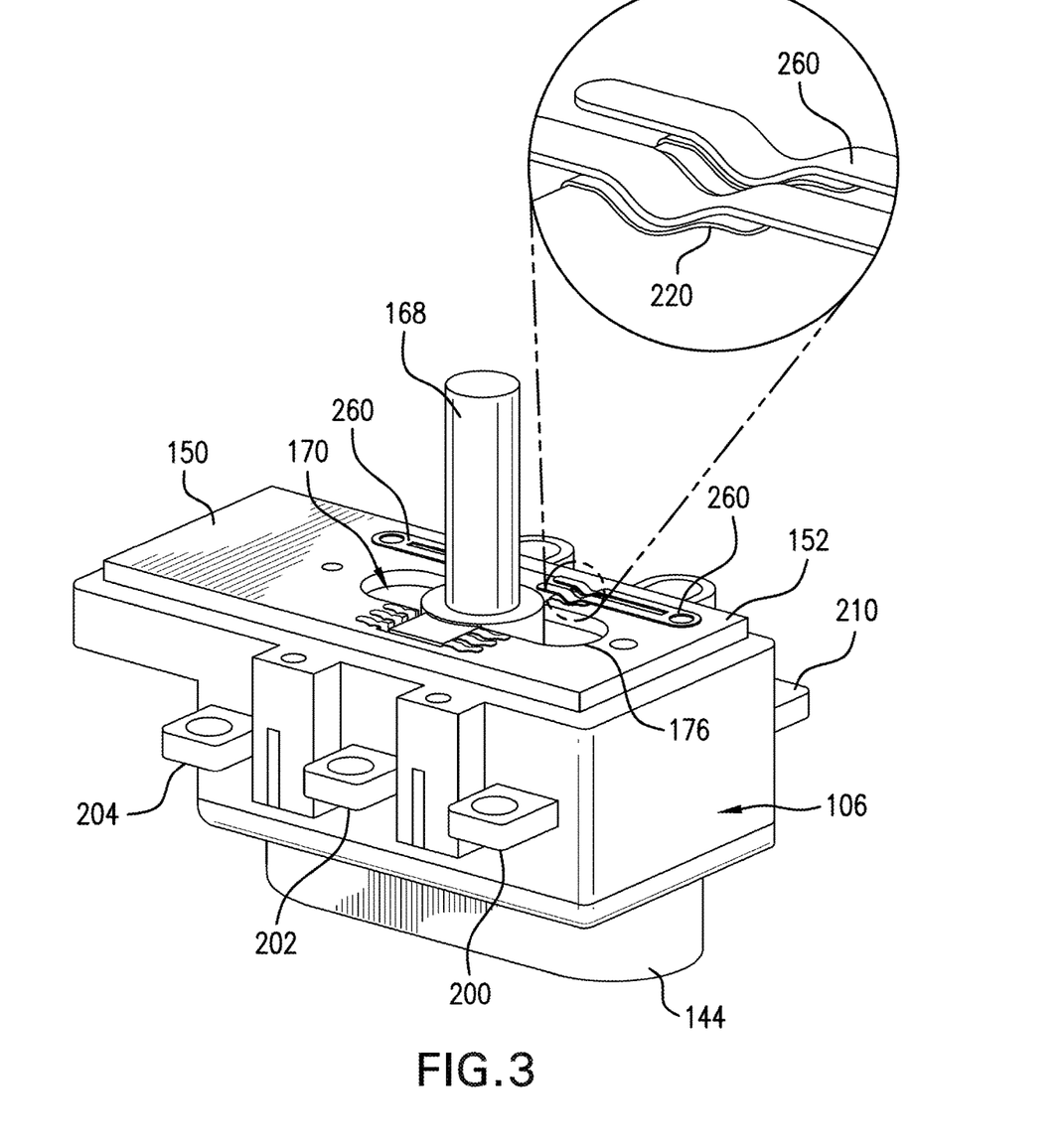
FIG. 3 is a perspective view of the auxiliary switch of FIG. 1 with a first housing part of a switch housing removed.

It should, of course, be understood that the description and drawings herein are merely illustrative and that various modifications and changes can be made in the structures disclosed without departing from the present disclosure. Referring now to the drawings, wherein like numerals refer to like parts throughout the several views, FIGS. 1-3 illustrate a modular auxiliary switch 100 according to the present disclosure. The switch 100 generally includes a housing 102, which can be defined by a first housing part 104 and a separate second housing part 106 secured to the first housing part 104.

As depicted, the first housing part 104 can be generally rectangular shaped including a pair of sidewalls 110, 112 and a pair of end walls 114, 116 interconnecting the sidewalls 110, 112. The second housing part 106 is correspondingly shaped and includes a pair of sidewalls 120, 122 and a pair of end walls 124, 126 interconnecting the sidewalls 120, 122. Each of the sidewalls 120, 122 can includes a step portion (only step portion 130 in sidewall 120 is visible) at the end wall 126.

To provide for a releasable connection between the first and second housing parts 104, 106, each of the sidewalls 110, 112 include first bosses (only first bosses 134 are visible) and each of the sidewalls 120, 122 include corresponding second bosses (only second bosses 138 are visible). The first and second bosses 134, 138 are configured to receive conventional fasteners.

Further, an extension part 140 of cylindrical shape is provided on a top wall 142 of the first housing part 104. Additionally, a lower cover member 144 is releasably connected to the second housing part 106. It should be appreciated that the configuration of the housing 102 is by way of example only and that alternative configurations for the housing 102 are contemplated without departing from the scope of this disclosure.

A printed circuit board (hereafter PCB) 150 is housed in one of the first housing part 104 and the second housing part 106 and is easily accessible by removal of the first housing part 104. In general, the PCB 150 which can be shaped to correspond to the shape of the housing 102 has a first side 152 facing an opening of the first housing part 104 and a second opposite side 154 facing an opening of the second housing part 106. Thus, the first die 152 and the second side 154 face in opposite directions.

An actuator mechanism 160 is housed in the first housing part 104 and coupled to the PCB 150. According to one aspect, the actuator mechanism 160 includes a solenoid driven actuator 162 housed on the extension part 140 and having a through bore 164 which reciprocally receives a plunger 168. The actuator mechanism 160 further includes an engagement member 170 secured to a distal end of the plunger 168. The engagement member 170 is located below the second side 154 of the PCB 150.

Figure 4:
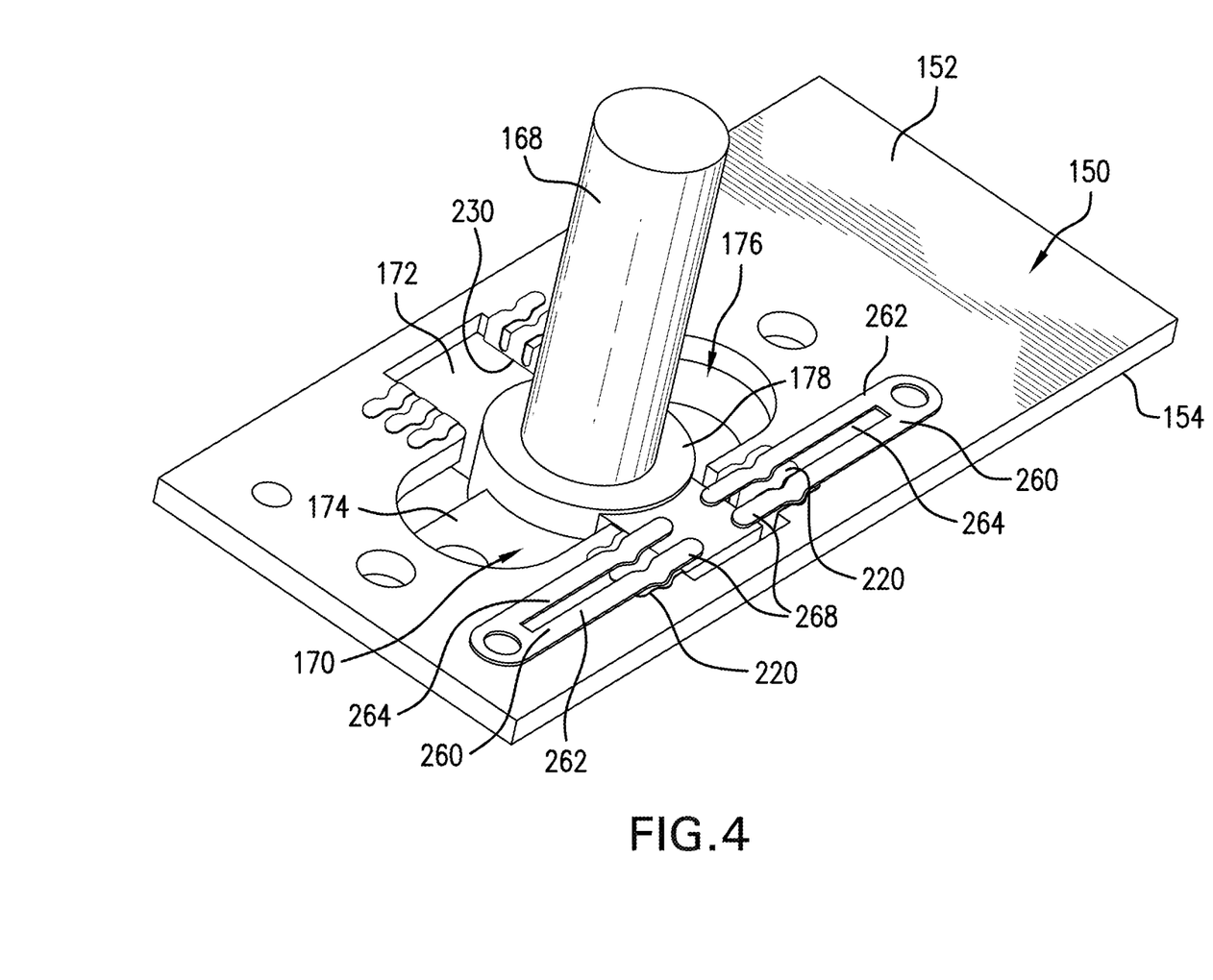
FIGS. 4 and 5 are perspective views of a printed circuit board together with an actuator mechanism of the auxiliary switch of FIG. 1.
Figure 5:
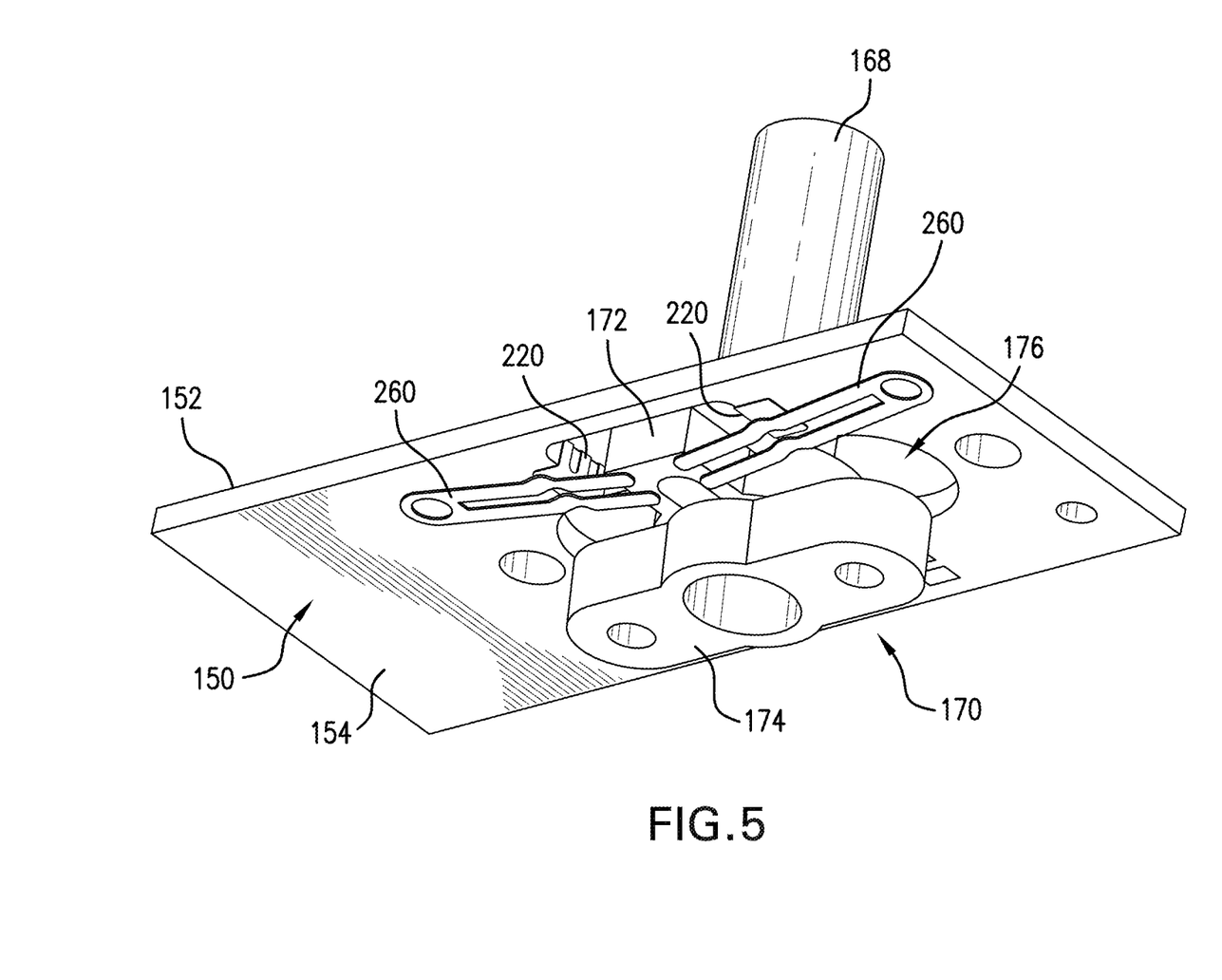

The engagement member 170 is best depicted in FIGS. 4 and 5. As shown, the engagement member 170 can include a first portion 172 and a second portion 174 provided beneath the first portion. The first portion 172 is elongated in a width direction of the PCB 150 and is direct contact with the second side 154. The second portion 174 is elongated in a length direction of the PCB 150. The PCB 150 includes a through hole 176 for accommodating the engagement member 170.

Actuation of the mechanism 160 moves the plunger 168 upwardly within the actuator 162, which in turn causes the engagement member 170 to displace contacts located on the PCB 150. With additional reference to FIG. 2, to connect the plunger 168 to the engagement member 170, the first portion 172 can be provided with a seat 178 having an opening 180 that is aligned with a threaded opening 182 in the plunger 168, which allows for connection via a threaded fastener (not shown).

As depicted in FIG. 2, the second portion 174 is seated on a mount 186 supported in the second housing part 106 by supports 190. At least one electrical connector for connection to an associated electrical component is supported in the second housing part 106 and covered by the lower cover member 144.

According to one aspect of the auxiliary switch 100, three electrical conductors 200, 202, 204 have their respective contacts extending outwardly from the sidewall 120 of the second housing part 106 and three electrical conductors (only electrical conductor 210 is visible) have their respective contacts extending outwardly from the sidewall 122 of the second housing part 106. Each of the electrical conductors is electrically connected to the PCB 150 in a known manner. It should be appreciated that depending on use, the auxiliary switch 100 can be provided with more or less than the depicted number of electrical conductors.

Figure 6:
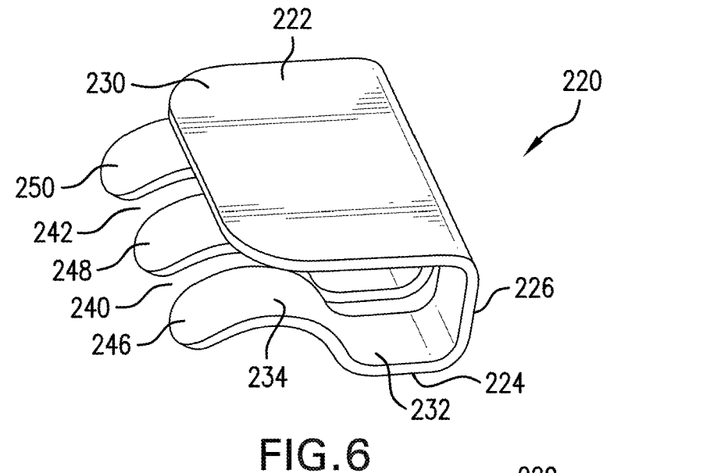
FIGS. 6 and 7 are perspective views of an electrical contactor of the printed circuit board.
Figure 7:
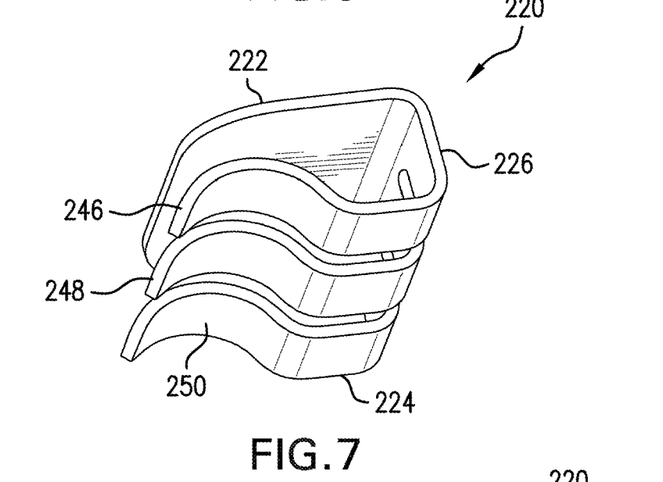
Figure 8:
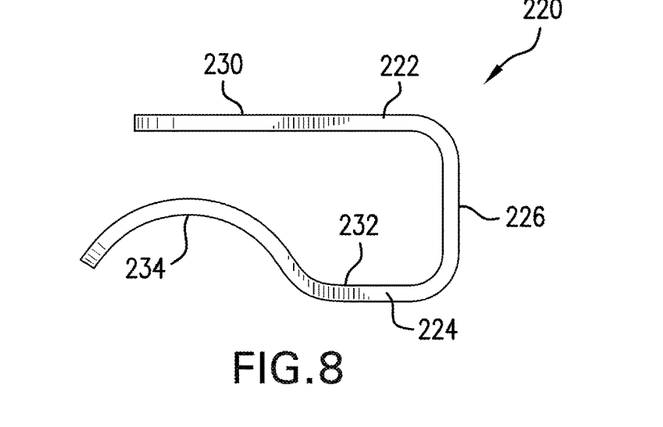
FIG. 8 is a side view of the electrical contactor of FIG. 6.

The modular auxiliary switch 100 can be configured on site for the specific use of the auxiliary switch. To allow for this versatility of the auxiliary switch 100, the present disclosure provides at least one exemplary electrical contactor 220 (FIGS. 6-8) which is separate from and selectively mounted to the PCB 150 so that an electrical contact surface of the electrical contactor 220 overlaps and is in direct contact with one of the first side 152 and the second side 154 to define an electrical contact pad on the PCB 150. With reference to FIGS. 6-8, the electrical contactor 220 comprises a first wall 222, a second wall 224 overlapping the first wall 222, and a base wall 226 interconnecting ends of the respective first and second walls 222, 224. The first wall 222 defines the electrical contact surface 230. In the depicted embodiment, the second wall 224 has a first portion 232 which extends parallel to the first wall 222 and a second portion 234 which is offset from the first portion 232 toward the first wall 222. Thus, a first spacing between the first portion 232 and the first wall 222 is greater than a second spacing between the second portion 234 and the first wall 222. According to one aspect, the second portion 234 of the second wall 224 is arcuate shaped, and a distal end of the second wall 224 extends outwardly past a distal end of the first wall 222.

Further, the second wall 224 can include at least one elongated slot which bifurcates the second wall 224 into engagement sections that can be fixed (e.g., soldered) to one of the first and second sides 152, 154 of the PCB 150. In the illustrated embodiment, the second wall 224 includes a first elongated slot 240 and a second elongated slot 242, the first and second slots 240, 242 trifurcating the second wall 224 into a first engagement section 246, a second engagement section 248, and a third engagement section 250. The first and second slots are properly spaced on the second wall 224 so that the engagement sections 246, 248, 250 are similarly rectangular shaped in plan view. To allow for flexing/displacement of the engagement sections 246, 248, 250, each of the first elongated slot 240 and the second elongated slot 242 extends onto the base wall 226. It should be appreciated that the electrical contactor 220 is configured so that the second spacing is smaller than a thickness of the PCB 150, and the arcuate shape of the trifurcated second wall 224 is configured to hold flat the first wall 222 to the one side of the PCB 150.

With reference to FIGS. 3-5, at least one electrical contactor 220 is mounted to the PCB 150 with its electrical contact surface 230 located on the first side 152. As shown, the PCB 150 further includes at least one electrical contact 260 mounted to the first side 152 and electrically connected to the electrical contact surface 230 of the at least one electrical contactor 220. In the depicted embodiment, a pair of electrical contacts 260 is mounted to the first side 152, each electrical contact 260 is a bifurcated leaf contact having a body 262 with an elongated slit 264 extending along a majority length of the body 262. An end portion 268 of each electrical contact 260 projects into the through hole 176 for engagement with the first portion 172 of the engagement member 170, and movement of the engagement member 170 displaces each electrical contact 260 from the corresponding electrical contact surface 230. According to another aspect, each electrical contactor 220 can be mounted to the PCB 150 with the electrical contact surface 230 located on the second side 152. With this arrangement, each electrical contact 260 is electrically connected to the second wall 224 of the electrical contactor 220.

With the modular aspect of the exemplary auxiliary switch 100, locating the electrical contact surface 230 of the electrical contactor 220 only on the first side 152 of the PCB 150 as depicted configures the auxiliary switch 100 as a normally closed single pole single throw auxiliary switch. According to another aspect (not shown), locating the electrical contact surface 230 of the electrical contactor 220 only on the second side 154 of the PCB 150 configures the auxiliary switch 100 as a normally open single pole single throw auxiliary switch. Still further, at least one second electrical contactor configured identical to the electrical contactor 220 can mounted to the PCB 150 in a similar manner so that a second electrical contact surface of the second electrical contactor overlaps and is in direct contact with one of the first side 152 and the second side 154 of the PCB 150. This second electrical contact surface can define a second electrical contact pad on the PCB 150. Therefore, with the electrical contact surface 230 of the electrical contactor 220 located on the first side 152 of the PCB 150, locating the second electrical contact surface of the second electrical contactor on the second side 154 of the PCB 150 configures the auxiliary switch 100 as a single pole double throw auxiliary switch.

Accordingly, the present disclosure allows the auxiliary switch 100 to have differing configurations depending on the end use of the auxiliary switch. The exemplary electrical contactor 220 can be formed of a spring steel and includes a first plating comprised of silver and a second exterior plating comprised of gold, which when properly mounted to the PCB 150, allows the auxiliary switch 100 to meet 10 mA to 5 A load current requirements.

Accordingly, the present disclosure provides the modular auxiliary switch 100 that uses the stamped and formed trifurcated electrical contactor 220 that clips onto the PCB 150 in place of the conventional PCB electrical pad. The electrical contactor 220 is pre-electroplated with the required gold over silver plating. The electrical contactor 220 is slid on one of the first and second sides 152, 154 of the PCB 150 and the trifurcated second wall 224 can be soldered to a solder pad on the PCB 150. The electrical contactor 220 is configured such that the trifurcated second wall 224 squeeze the PCB 150, which holds the flat first wall 222 flush to the PCB 150.

Thus, the modular auxiliary switch 100 comprises a single PCB 150 to provide both normally open and normally closed switches with a single solenoid driven actuator 162. The auxiliary switch 100 is modular, and can be configured as normally open or normally closed depending on the side 152, 154 of the PCB 150 that the electrical contact surface 230 of the electrical contactor 220 is mounted. In addition, a single pole double throw auxiliary switch 100 can be provided by mounting electrical contactors to both sides of the PCB 150. This exemplary auxiliary switch 100 is very compact and provides modularity of up to four auxiliary switches that can be any combination of normally open single pole single throw, normally closed single pole single throw or single pole double throw configuration.

The present disclosure further provides an exemplary method of configuring an auxiliary switch. The method comprises providing a printed circuit board (PCB) 150 having a first side 152 and an opposite second side 154; and providing a separate first electrical contactor 220 configured to be mounted to the PCB 150 so that a first electrical contact surface 230 of the first electrical contactor 220 overlaps and is in direct contact with one of the first side 152 to configure the auxiliary switch 100 as a normally closed single pole single throw switch and the second side 154 of the PCB 150 to configure the auxiliary switch 100 as a normally open single pole single throw switch. With the first electrical contact surface 230 located on the first side 152 of the PCB 150, the exemplary method includes locating a second electrical contact surface of a second electrical contactor on the second side 154 of the PCB 150 to configure the auxiliary switch 100 as a single pole double throw auxiliary switch.

It will be appreciated that the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A modular assembly for an auxiliary switch comprising:
a printed circuit board including a first side and a second opposite side; and
a first electrical contact separate from the printed circuit board, the first electrical contact having a planar first wall, a trifurcated second wall spaced from the first wall and having an arcuate section extending toward the first wall, and a base wall interconnecting the first and second walls, the first electrical contact selectively fixed to the printed circuit board with the first wall in direct contact with the first side to define a first electrical contact pad on the printed circuit board and the trifurcated second wall in direct contact with the second side.

2. The modular assembly of claim 1, including a second electrical contact separate from the printed circuit board and having a configuration identical to the first electrical contact, the second electrical contact fixed to the printed circuit board with a planar first wall of the second electrical contact in direct contact with one of the first side and the second side to define a second electrical contact pad of the printed circuit board and a second trifurcated wall of the second electrical contact in direct contact with the other of the first side and the second side.

3. The modular assembly of claim 2, wherein the planar first wall of the second electrical contact in direct contact with the first side of the printed circuit board and the second trifurcated wall of the second electrical contact in direct contact with the second side of the printed circuit board.

4. The modular assembly of claim 2, wherein the planar first wall of the second electrical contact in direct contact with the second side of the printed circuit board and the second trifurcated wall of the second electrical contact in direct contact with the first side of the printed circuit board.

5. A modular auxiliary switch comprising:
a housing including a first housing part and a separate second housing part secured to the first housing part;
a printed circuit board housed in one of the first housing part and the second housing part, the printed circuit board having a first side facing the first housing part and a second opposite side facing the second housing part;
an actuator mechanism housed in the first housing part and coupled to the printed circuit board; and
a first electrical contactor separate from and selectively mounted to the printed circuit board so that a first electrical contact surface of the first electrical contactor overlaps and is in direct contact with one of the first side and the second side to define a first electrical contact pad on the printed circuit board.

6. The modular auxiliary switch of claim 5, wherein the actuator mechanism includes a solenoid driven actuator having a plunger and an engagement member secured to a distal end of the plunger, the engagement member in direct contact with the second side of the printed circuit board.

7. The modular auxiliary switch of claim 5, wherein the first electrical contactor is formed of a spring steel and includes a first plating comprised of silver and a second exterior plating comprised of gold.

8. The modular auxiliary switch of claim 5, wherein locating the first electrical contact surface on the first side configures the auxiliary switch as a normally closed single pole single throw auxiliary switch and locating the electrical contact surface on the second side configures the auxiliary switch as a normally open single pole single throw auxiliary switch.

9. The modular auxiliary switch of claim 8, further including a second electrical contactor separate from and selectively mounted to the printed circuit board so that a second electrical contact surface of the second electrical contactor overlaps and is in direct contact with one of the first side and the second side to define a second electrical contact pad on the printed circuit board, wherein with the first electrical contact surface located on the first side locating the second electrical contact surface on the second side configures the auxiliary switch as a single pole double throw auxiliary switch.

10. The modular auxiliary switch of claim 9, wherein the first electrical contactor comprises:
  a first wall defining the first electrical contact surface,
  a second wall overlapping the first wall, and
  a base wall interconnecting ends of the respective first and second walls,
  wherein the second wall has a first portion which extends parallel to the first wall and a second portion which is offset from the first portion toward the first wall so that a first spacing between the first portion and the first wall is greater than a second spacing between the second portion and the first wall,
  wherein the second electrical contactor is configured identical to the first electrical contactor.

11. The modular auxiliary switch of claim 10, wherein the electrical contactor is formed of a spring steel and includes a first plating comprised of silver and a second exterior plating comprised of gold.

12. The modular auxiliary switch of claim 10, wherein second wall includes a first elongated slot and a second elongated slot, the first and second slots trifurcating the second wall into a first engagement section, a second engagement section, and a third engagement section, each of the first elongated slot and the second elongated slot extends onto the base wall.

13. The modular auxiliary switch of claim 10, herein the second portion of the second wall is arcuate shaped.

14. The modular auxiliary switch of claim 13, wherein second wall includes a first elongated slot and a second elongated slot, the first and second slots trifurcating the second wall into a first engagement section, a second engagement section, and a third engagement section, each of the engagement sections being rectangular shaped.

15. The modular auxiliary switch of claim 14, wherein each of the first elongated slot and the second elongated slot extends onto the base wall, and a distal end of the second wall extends outwardly past a distal end of the first wall.

16. The modular auxiliary switch of claim 14, wherein the first electrical contact is configured so that the second spacing is smaller than a thickness of the printed circuit board, and the arcuate shape of the trifurcated second wall is configured to hold flat the first wall to the one side of the printed circuit board.

17. A method of configuring an auxiliary switch comprising:
  providing a printed circuit board having a first side and an opposite second side;
  providing a separate first electrical contactor configured to be selectively mounted to the printed circuit board so that a first electrical contact surface of the first electrical contactor overlaps and is in direct contact with one of the first side to define an electrical contact pad so as to configure the auxiliary switch as a normally closed single pole single throw switch and the second side of the printed circuit board to configure the auxiliary switch as a normally open single pole single throw switch;
  providing a separate second electrical contactor to be mounted to the printed circuit board so that a second electrical contact surface of the second electrical contactor overlaps and is in direct contact with one of the first side and the second side; and
  locating the second electrical contact surface on the second side with the first electrical contact surface located on the first side to configure the auxiliary switch as a single pole double throw auxiliary switch.

* * * * *

UNITED STATES PATENT AND TRADEMARK OFFICE
CERTIFICATE OF CORRECTION

PATENT NO. : 10,497,527 B2
APPLICATION NO. : 15/959428
DATED : December 3, 2019
INVENTOR(S) : Christopher Kenneth Wyatt et al.

It is certified that error appears in the above-identified patent and that said Letters Patent is hereby corrected as shown below:

On the Title Page

Column 1, Item (73) Assignee:
Change "Blagnac (FI)" to --Blagnac (FR)--.

Signed and Sealed this
Eighteenth Day of February, 2020

Andrei Iancu
*Director of the United States Patent and Trademark Office*